US007949141B2

(12) United States Patent
Reilly et al.

(10) Patent No.: US 7,949,141 B2
(45) Date of Patent: May 24, 2011

(54) PROCESSING AUDIO SIGNALS WITH HEAD RELATED TRANSFER FUNCTION FILTERS AND A REVERBERATOR

(75) Inventors: Andrew Peter Reilly, Hurlstone Park (AU); Adam Richard McKeag, Randwick (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 1497 days.

(21) Appl. No.: 10/970,123

(22) Filed: Oct. 21, 2004

(65) Prior Publication Data

US 2005/0100171 A1 May 12, 2005

Related U.S. Application Data

(60) Provisional application No. 60/519,786, filed on Nov. 12, 2003.

(51) Int. Cl.
*H03G 3/00* (2006.01)

(52) U.S. Cl. .............................. 381/63; 381/61; 381/310

(58) Field of Classification Search .............. 381/61–63, 381/310, 119, 1–17
See application file for complete search history.

(56) References Cited

U.S. PATENT DOCUMENTS 4,027,101 A * 5/1977 De Freitas et al. .............. 381/18
4,731,848 A 3/1988 Kendall et al. .................. 381/63
5,371,799 A * 12/1994 Lowe et al. ................... 381/310
5,546,465 A * 8/1996 Kim ................................ 381/18
5,809,149 A 9/1998 Cashion et al. ................. 381/17
6,021,206 A 2/2000 McGrath ....................... 381/310
6,188,769 B1 2/2001 Jot et al. .......................... 381/63
6,385,320 B1 * 5/2002 Lee ................................. 381/17
6,421,446 B1 * 7/2002 Cashion et al. ................. 381/17
6,574,649 B2 6/2003 McGrath ....................... 708/420
7,149,314 B2 * 12/2006 Dahl et al. ....................... 381/63
2002/0057806 A1 5/2002 Hasebe ........................... 381/63

FOREIGN PATENT DOCUMENTS

JP 55-52700 4/1980
JP 06-66200 U 9/1994
JP 2002-044799 2/2002

(Continued)

OTHER PUBLICATIONS

Supplementary European Search Report for Application No. 04789617.0 mailed on Aug. 11, 2009.
A. Gogu and M. Topa. “Coefficients’ computation for Jot’s reverberation algorithm.” *10th Mediterranean Electrotechnical Conference* (*MELECON 2000*). May 2000, vol. 1, pp. 45-48.

(Continued)

*Primary Examiner* — Vivian Chin
*Assistant Examiner* — Fatimat O Olaniran
(74) *Attorney, Agent, or Firm* — Dov Rosenfeld; INVENTEK

(57) ABSTRACT

A method, an apparatus, and a software product to process a plurality of input audio signals. The apparatus accepts a plurality of input signals and includes a multi-input, multi-output reverberator arranged to generate a set of output signals including delayed reverberation components simulating the reverberations a listener is likely to hear in a listening environment. The apparatus further includes a multi-input, two-output filter accepting the outputs of the reverberator and the plurality of input terminals, providing outputs for the left and right ears, and configured to implement a set of head related transfer functions corresponding to a listening environment and a set of directions of a listener in the listening environment. The apparatus is such that a listener listening to the outputs through headphones has the sensation of listening to the plurality of input audio signals as if they are emanating from a plurality of loudspeakers spatially located in the listening environment at a corresponding plurality of directions.

52 Claims, 10 Drawing Sheets

FOREIGN PATENT DOCUMENTS

| | | | |
|---|---|---|---|
| WO | WO 93/23847 | | 11/1993 |
| WO | WO 99/14983 | | 3/1999 |
| WO | WO 9914983 | A1 * | 3/1999 |
| WO | WO 99/33325 | | 7/1999 |

OTHER PUBLICATIONS

Search Report and written opinion for counterpart International application No. PCT/AU2004/001479.

* cited by examiner

PROCESSING AUDIO SIGNALS WITH HEAD RELATED TRANSFER FUNCTION FILTERS AND A REVERBERATOR

RELATED APPLICATION

The present invention claims priority of U.S. Provisional Patent Application Ser. No. 60/519,786 filed Nov. 12, 2003, titled AUDIO SIGNAL PROCESSING SYSTEM AND METHOD, to inventors Reilly et al. U.S. Provisional Patent Application Ser. No. 60/519,786 is hereby incorporated herein by reference.

BACKGROUND

The present invention relates to the field of simulating spatialized 3 dimensional (3D) audio effects around a listener via headphones or the like and, in particular, discloses a compact system for audio simulation.

Various systems have been proposed for the simulation of "out of head" audio effects for headphone listeners. Most traditional headphone arrangements do not include this processing so that when a listener listens on headphones to an audio track designed to be played over stereo loudspeakers or multi-formatted loudspeakers, the sound appears to emanate from inside the listener's head.

A number of systems have been proposed and are well known for providing the effect of spatializing the audio signals, including giving a listener using headphones the illusion that he or she is listening to sound sources located around the listener. Example of such systems can be found in U.S. Pat. No. 6,574,649 issued Jun. 3, 2003 to inventor McGrath, and U.S. patent application Ser. No. 09/647,260 filed Jan. 6, 1999 to inventors McGrath, et al.

Real listening rooms are known to produce reverberation. It is desirable for a headphone spatialization system to include a simulation of the reverberations that occur in a listening environment. It is further desirable to so provide headphone spatialization and realistic simulation of the reverberation at a reasonable cost, e.g., with processing that has relatively low computational requirements.

For example, a listener, when listening to a suitably processed audio signal generated by the spatialization system and emitted by standard headphones, should be given the impression that there is a loudspeaker—called a "virtual" loudspeaker—located at an appropriate position relative to the listener's head. The listener should further be given the impression that he or she is listening in a desired listening environment. Thus, the spatialization process implemented by the spatialization system should provide a simulation of acoustic echoes in a desired listening environment that sounds natural. For example, the pattern of acoustic echoes created by the process should have different arrival times that are uncorrelated for each of the multiple virtual signals so as to provide for a realistic and natural sensation of room acoustics. Furthermore, it is desired that such a spatialization system provide for multiple virtual loudspeaker positions to be simulated at once with the system accepting a plurality of audio input signals each of which is to be "virtualized" at a different location.

SUMMARY

One aspect of the present invention is spatialization of audio around a listener when using headphone devices or the like, the spatialization including the simulation of the echoes likely to be produced in a listening environment.

Disclosed herein is an apparatus arranged to process a plurality of input audio signals. The apparatus includes a plurality of input terminals to accept a plurality of input signals. The apparatus further includes a multi-input, multi-output reverberator accepting the plurality of input signals and arranged to generate a set of output signals that include formed delayed reverberation components simulating the reverberations a listener is likely to hear in a listening environment. The apparatus further includes a multi-input, two-output filter with inputs coupled to the outputs of the reverberator. The inputs of the filter are also coupled to the plurality of input terminals. The filter provides two outputs, one for the left ear and one for the right ear, and is arranged to implement a set of head related transfer functions corresponding to a listening environment and a set of directions of a listener in the listening environment. The two outputs are playable through headphones. A listener listening to the left and right output signals in the listening environment through headphones has the sensation of listening to the plurality of input audio signals as if they are emanating from a plurality of loudspeakers spatially located in the listening environment to form a corresponding plurality of directions for the listener.

In one embodiment of the reverberator, the reverberator is arranged to form the reverberation components, and the forming of at least one of the reverberation components includes combining a plurality of the accepted input signals. In such an embodiment, the reverberator is arranged to process each of the input signals differently.

Also disclosed herein is a method to process a plurality of input audio signals. The method includes accepting a plurality of input signals, and generating a set of reverberator output signals from the plurality of input signals. The generating includes forming delayed reverberation components simulating the reverberations a listener is likely to hear in a listening environment. The method further includes filtering combinations of the input signals and reverberator output signals to produce two outputs, one for the left ear and one for the right ear. The filter implements a set of head related transfer functions corresponding to a listening environment and a set of directions of a listener in the listening environment. The two outputs are playable through headphones. A listener listening to the left and right output signals in the listening environment through headphones has the sensation of listening to the plurality of input audio signals as if they are emanating from a plurality of loudspeakers spatially located in the listening environment to form a corresponding plurality of directions for the listener.

In addition, disclosed herein is a carrier medium carrying at least one computer-readable code segment to instruct a processor of a processing system to implement a method to process a plurality of input audio signals. The method includes the steps described in the above paragraph.

BRIEF DESCRIPTION OF THE DRAWINGS

Preferred embodiments of the present invention will now be described with reference to the accompanying drawings.

DETAILED DESCRIPTION

Described herein are a method and an apparatus for creating signals that are playable over headphones or over loudspeakers, and that that provide, e.g., to a listener through headphones, the sensation of listening to a set of loudspeakers at a set of locations in a room, including simulating the reverberations in the room. While embodiments of the invention are designed for playback on headphones, such embodiments can also be used in loudspeaker playback systems as a method of creating realistic ambiance in multi-channel environments.

Figure 1:
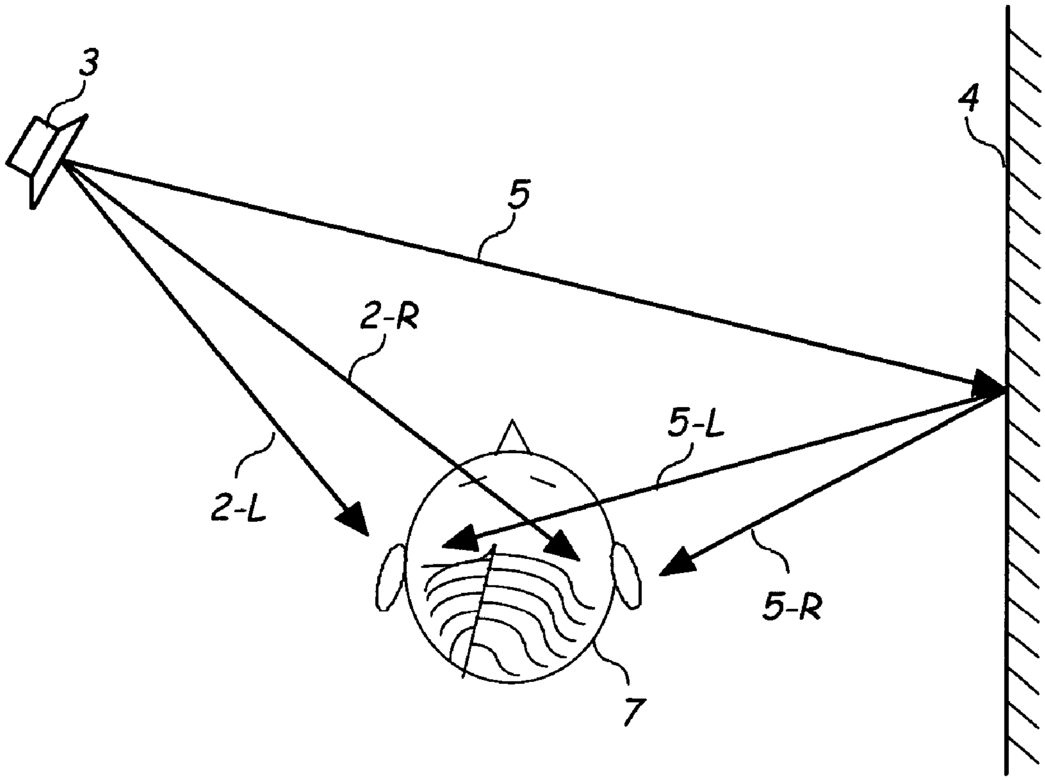
FIG. 1 (Prior Art)
FIG. 1 is a schematic illustration of a listening environment, and describes some of the head related transfer functions for a listener listening to a sound from a location.

FIG. 1 illustrates the audio projection concept that it is well understood by those skilled in the art. When a listener 7 is exposed to the sound from a sound source 3, the direct radiated signal is propagated to the listener's left and right ears via the two pathways, 2-L and 2-R, respectively. Note that "-R" and "-L" in reference numerals or characters refer to the left ear and the right ear, respectively, of a listener. After the direct-sound components arrive, other, reflected sounds may reach the listeners ears. FIG. 1 shows arrivals 5-L and 5-R that reflected off a wall 4. The acoustic properties of the wall 4 typically affect acoustic properties, such as the frequency response of the echoes 5-L and 5-R. FIG. 1 represents a listening environment that is desired to be experienced by a listener listening binaurally via headphones. It is desired to create for the listener listening on the headphones the experience of listening in the room to a set of loudspeakers spatially located at different locations around the listener.

Figure 2:
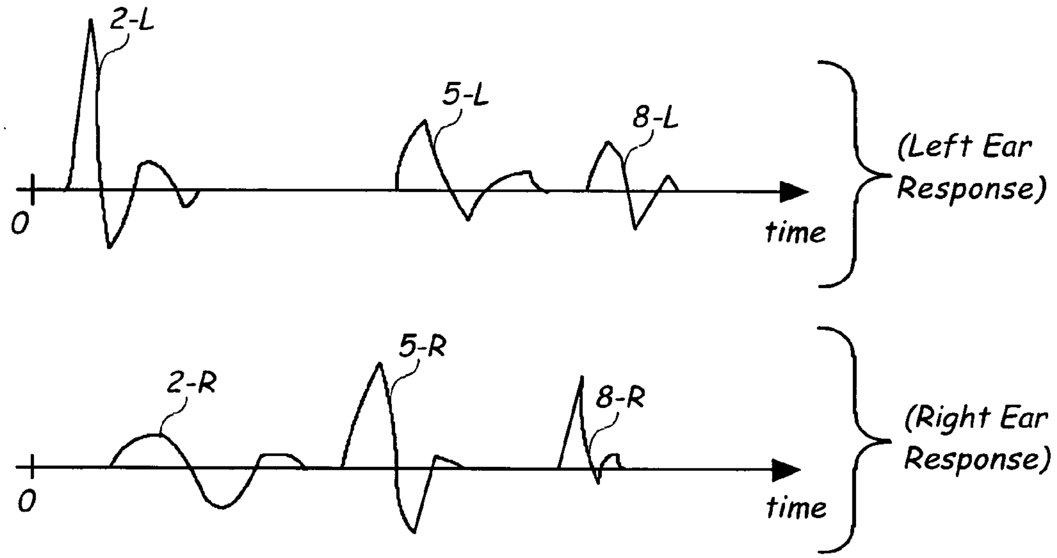
FIG. 2 illustrates a series of impulse response functions for a sound at a listener's ear for the arrangement of FIG. 1 when the sound source is an impulse sound.

FIG. 2 shows an example of impulse responses from the source to the left and right ears of the listener in the listening environment of FIG. 1. That is, FIG. 1 shows arrivals at the ears from an impulse sound source 3. Sound arrivals at the left ear are shown as 2-L, 5-L and 8-L, and those at the right ear shown as 2-R, 5-R and 8-R. The impulse responses 2-L and 5-L correspond to the corresponding direct and reflected propagation paths shown in FIG. 1. The waveform of 8-L indicates another echo arrival, perhaps reflected from yet another surface in the room. These three echo arrivals, as shown in FIG. 2, are indicative of the first three discrete sound arrivals. Typically the series of sound arrivals continues over time, with the time-density of the echo arrivals increasing rapidly as time passes, and the intensity of the echo arrivals decreasing with time.

The shapes of the waveforms shown in FIG. 2 are drawn as examples, but are intended to be representative of the shapes that would typically occur in a real listening experience. For example, the direct sound arrival at the left ear 2-L shows an earlier arrival time and a higher peak value than the direct sound arrival at the right ear 2-R. This is in keeping with the situation shown in FIG. 1 that the sound source 3 is closer to the listener's left ear. Likewise, FIG. 2 shows the left and right ear responses, and includes components of the echo, shown in FIG. 1 as echo 5, reaching the user's right ear—as shown by impulse response part 5-R—earlier and with greater amplitude than the arrival at the left ear (impulse response part 5-L).

The shape of an impulse response corresponding to one sound-arrival, e.g., 2-L in FIG. 2, is often referred to as a Head Related Impulse Response (HRIR) of the listener's ear for the sound location. A HRIR is often specified in the frequency domain, in which case it is called a Head Related Transfer Function (HRTF). Both of these terms are used interchangeably. Typically, HRTFs are specified in pairs, because one HRTF such as 2-L to the listener's left ear is of little use unless it is used along with its corresponding 2-R HRTF to the listener's right ear. There is normally one exception to this rule, which occurs for sound arrivals that reach the listener from a direction that lies in the medial plane of the listener so that the left and right ears hear the same sounds. For these medial-plane sound arrivals, the left and right HRTF signals are typically identical, so that only one HRTF is specified, unless the system is intended to simulate asymmetrical anatomical features of a particular listener.

One embodiment of the invention includes a method of simulating an acoustic environment that includes reverberation, i.e., the generation of echoes. Another embodiment is an apparatus that includes simulating the environment. Another embodiment of the invention is a method of generating signals for playback, e.g., via headphones. The method incorporates the simulating of the acoustic environment such that when the generated signals are played back to a listener via headphones, the listener is given the impression that he or she is in the listening environment. This includes the listener having the impression that a virtual loudspeaker is located in space in the appropriate position relative to the listener's head. Another embodiment is an apparatus for generating the signals for playback.

Embodiments of the invention also accept a plurality of input audio signals, each corresponding to a different location in space, and processes the signals for playback over headphones such that a listener is given the impression there he or she is listening to the plurality of audio signals from a plurality of virtual loudspeakers, each at the different corresponding location in space. Thus, a plurality of virtual loudspeaker locations is created.

Embodiments of the invention further provide for playback of audio signals that includes simulation of acoustic echoes that would occur in a room and that sounds natural. One method embodiment includes creating a plurality of virtual loudspeaker locations and creating a pattern of echo arrivals for each virtual loudspeaker location. The patterns can be different for each virtual loudspeaker location. In another version, the patterns are made uncorrelated for each virtual loudspeaker direction relative to the listener. The inventors have found that providing echo patterns that are substantially uncorrelated for the different virtual loudspeaker direction provides for a realistic and natural sensation of room acoustics.

The virtual loudspeaker locations are created from knowledge or assumptions about the HRTF pairs for each location. The directional processing uses HRTF filter pairs.

One aspect of the invention is the modest computational power and memory requirement of an apparatus to process the input to generate the signals for playback. A number of design choices have been made to achieve this. One aspect is restricting the number of sound-arrival directions. By restricting the number of directions, all the directional processing needed to account for all the directions is achievable using multi-input, multi-output filter HRTF that uses a small set of filters to implement a bank of HRTF filter pairs. In one embodiment, each direct sound, and every separate echo arrival is fed through one of the HRTF filter pairs in the HRTF filter bank. Another aspect providing for the modest computational and memory requirement is the use in the apparatus of a multiple-input/multiple-output reverberator to create the echo arrivals. The reverberator uses a recursive filter structure, e.g., a structure that includes feedback, to provide a multiple-input/multiple-output reverberator to create the echo arrivals.

Figure 12:
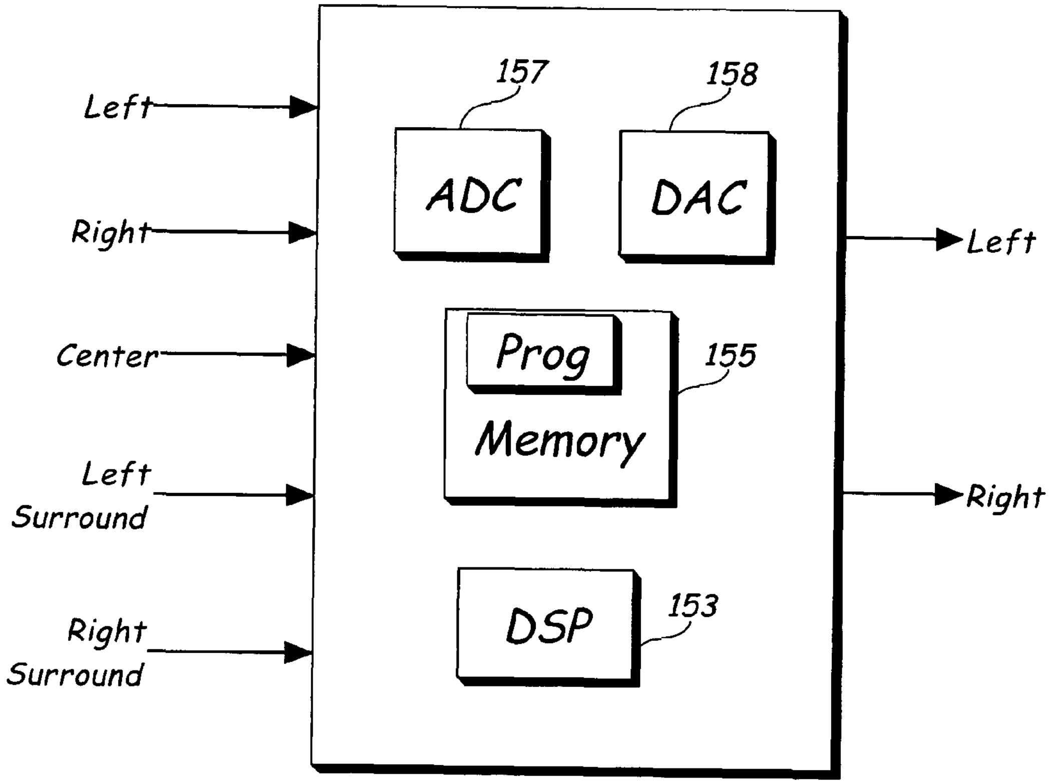
FIG. 12 illustrates a DSP processor embodiment of the invention with analog inputs and outputs.

One apparatus embodiment of the invention is shown in FIG. 12, and is implemented using a Digital Signal Processor (DSP) device, and in particular a DSP system that includes a DSP device 153 and a memory 155 that contains programming instructions. The apparatus includes a set of input terminals to accept a set of audio signals, and two outputs, one for the left ear, and one for the right ear. The inventors have found a particularly suitable DSP system is the Motorola 56000 DSP board made by Motorola, Inc. (Schaumburg, Ill.). One of skill in the art can be assumed to be readily familiar with the operation and programming of such boards. Thus, an embodiment of the invention is in the form of a carrier medium e.g., a memory or storage device, that carries a set of computer readable code segments that instruct one or more processors of a processing system to implement a method that includes the method steps described herein. Further, one embodiment is designed for 5 channel input and for playback over a set of headphones. The embodiment includes the required analog to digital and digital to analog converters for digitizing the input and generating analog output in the case that the inputs and outputs are analog. A sample analog-to-digital converter 157 and a sample digital-to-analog converter 158 are shown in FIG. 12. In one embodiment, the input is already digital, in the form of 5.1-channel Dolby Digital® signals, such that no analog-to-digital converters are required for the input.

Figure 3:
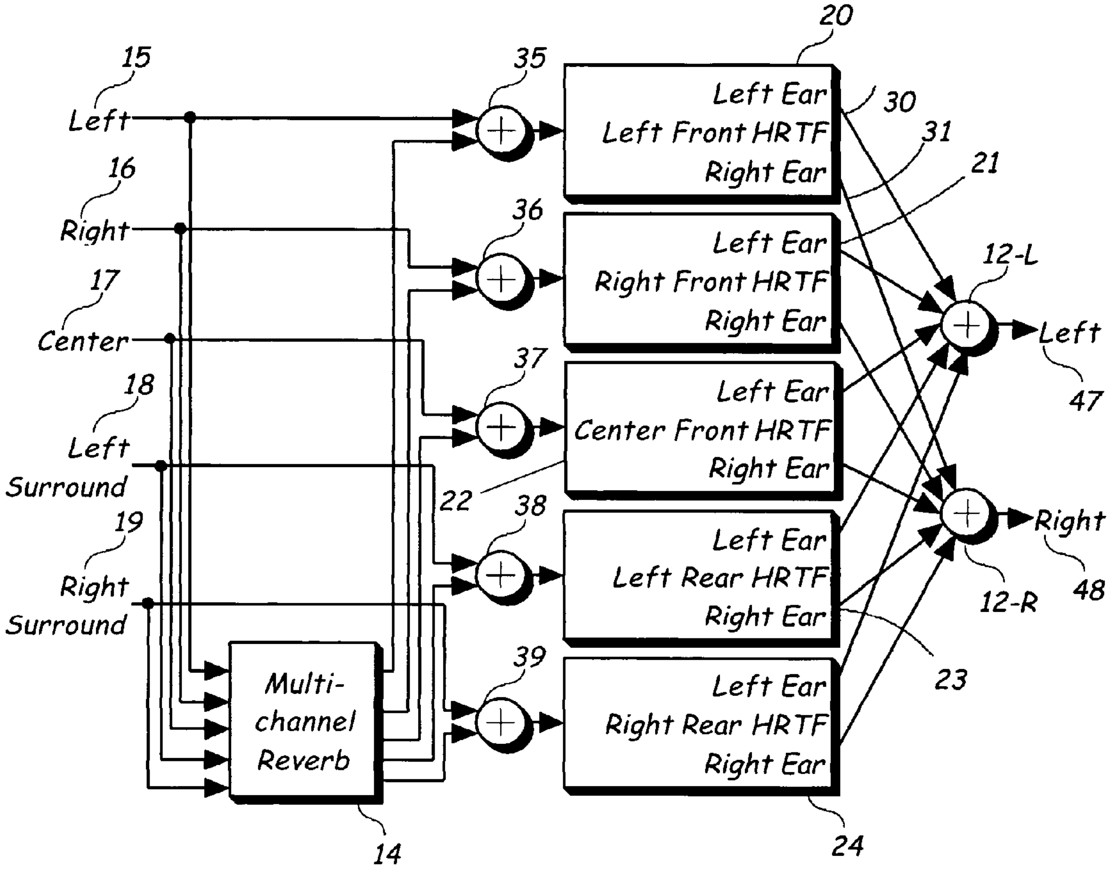
FIG. 3 is a simplified block diagram of one embodiment of the present invention.

One apparatus embodiment is shown schematically in FIG. 3. The apparatus includes a set of input terminals to accept a set of input audio signals. The set of input signals include a 5-channel digital input including left, right, center, left surround (also called left rear) and right surround (also called right rear) channels 15-19, respectively. The set of signals is coupled to a respective input terminal of a multi-input, multi-output head related transfer function filter via a corresponding summer unit 35-39, respectively. The multi-input, multi-output filter has two sets of outputs, one for the left ear and one for the right ear. In one version, each of the signals 15-19 is coupled to the input of a corresponding HRTF filter 20, 21, 22, 23, and 24, respectively, via the corresponding summer unit 35-39, respectively. Each of the HRTF filters provides a left and right filter output, e.g., outputs 30 and 31 for filter 20. The apparatus assumes a fixed number of sound arrival directions 15-19, in this case 5. The HRTF filters 20-24 are used to provide all the directional processing. Each HRTF pair defines the HRTF of the listener from the respective location's direction, e.g., location directions assumed of virtual loudspeakers, e.g., in an anechoic chamber.

In addition to the input signals, a multi-channel reverberator 14 generates echoes that are also processed by the HRTF filters. The multi-input, multi-output reverberator 14 accepts the set of input signals and generates a set of output signals, one for each of a set of directions, each output signal including delayed reverberation components simulating the reverberations a listener is likely to hear in a listening environment.

Hence, each direct sound and every separate echo arrival is fed through on of the HRTF filters in the filter bank. In one embodiment, each of the HRTF filters consists of separate left sub-filters and right sub-filter to provide the left- and right-ear outputs, respectively. Each left and right HRTF filter is implemented as a FIR filter.

One embodiment of the multi-channel reverberator is a recursive (feedback) filter that accepts multiple inputs and generates multiple outputs to simulate echo arrivals.

The left and right outputs of each of the filter structures 20-24 are separately summed by left and right summers, 12-L and 12-R, respectively to produce the left and right outputs 47 and 48, respectively. The separate outputs 47 and 48 are the left and right headphone output signals for playback using headphones.

Figure 4:
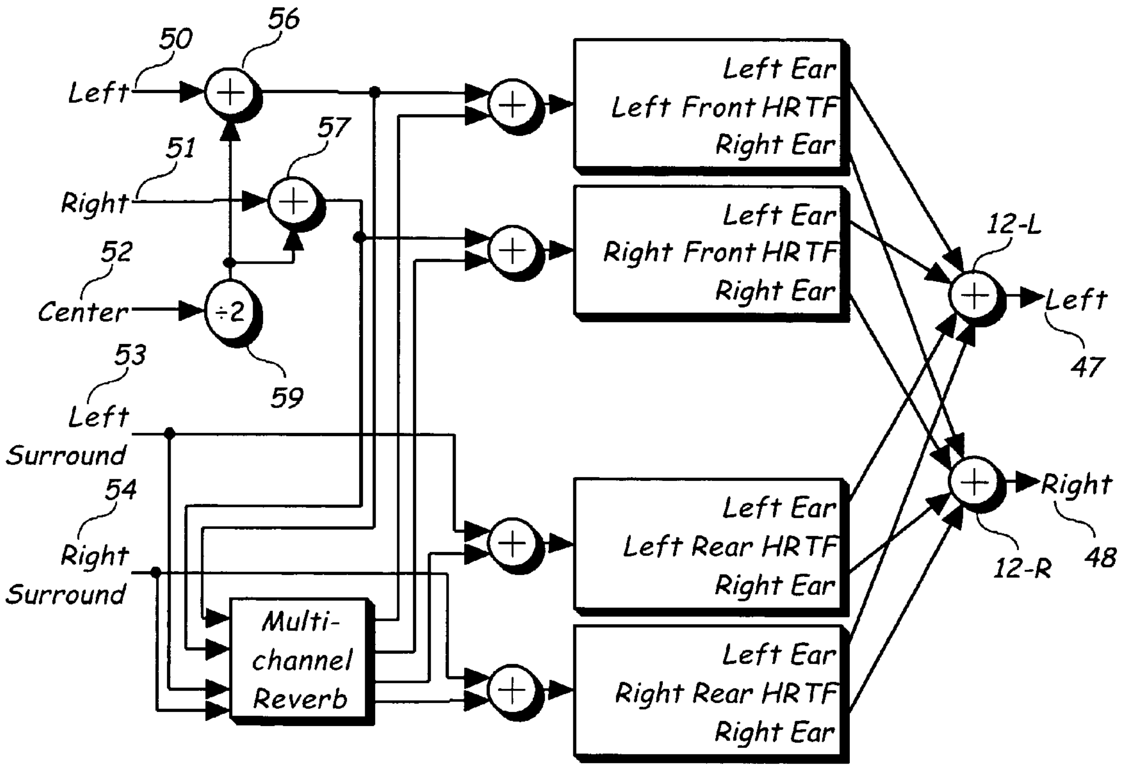
FIG. 4 is a simplified block diagram of a second simplified embodiment.

Various alternate embodiments of the arrangement of FIG. 3 are also within the scope of the invention. For example, in one embodiment, the center channel 17 can be eliminated by being "blended in" to the left and right channels 15, 16 prior to further processing. This can be achieved by adding half of the center channel to each of the left and right channels. Such an alternate embodiment is illustrated in FIG. 4, wherein the center channel 52, via a divider (a 0.5 attenuator) 59, is added to the left and right channels 50 and 51, respectively, by summing circuits (adders) 56 and 57, respectively. This simplification reduces the overall computational demands. The remainder of the apparatus is a 4-channel (L', R', left surround 53, and right surround 54) to 2-channel binauralizer.

Figure 5:
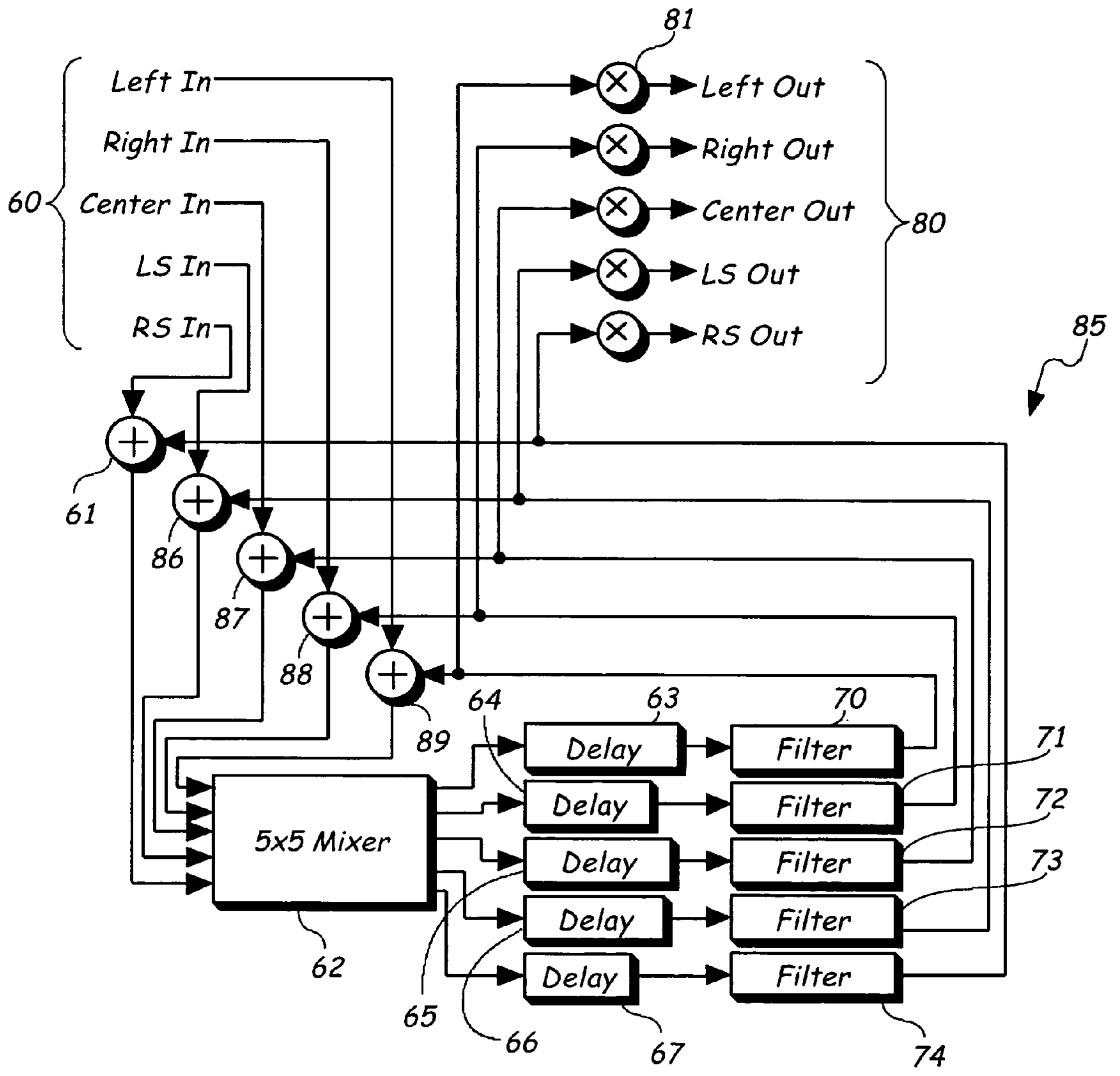
FIG. 5 is a simplified block diagram reverberator of the embodiment of FIG. 3.

One embodiment of the multi channel reverberator 14 is shown in FIG. 5. The reverberator includes a feedback signal path for each of the directions of the multi-input, two-output HRTF filter. Each feedback signal path includes a delay and filter, implemented in one embodiment as a combined delay and filter, and in another embodiment as a separate delay line followed by a filter.

Referring to FIG. 5, each of the 5 input channels 60 are summed, e.g., by adders 61, 86, 87, 88, and 89, respectively, with fed back signals to form a five-channel feedback path. The summed signals are input to a 5 by 5 mixer 62 to form a set of five mixed signals, one for each feedback signal path in the reverberator. The five mixed signals are input to a set of five delay and filter units, shown in FIG. 5 implemented as five delay lines 63-67, respectively, and five filters 70-74, respectively. As described below, one embodiment combines each delay and filter, so that the filter uses a part of the delay line.

Each of the five delay lines 63-67 delays its respective input by a different amount ("delay length"). Each respective output of the five delays 63-67 is fed to a respective one of the set of five filters 70-74 that filter and attenuate each of the signals as it is fed back to its respective one of the summers, e.g., summer 61. In one embodiment, the outputs of the filters are also amplified by a set of gain elements to form the set 80 of outputs of the multi-channel reverberator. The gain elements, e.g., gain element 81, have settable gains that are applied to ensure that the reverberation level is correctly simulated in a target listening environment. Each respective filter produces a desired decay rate that varies with the frequency for echoes produced by the respective feedback signal path, and each respective delay is selected to provide a desired reverberation pattern for the a target listening environment being simulated.

Alternate embodiments to the embodiment shown in FIG. 5 are possible. Such alternate embodiments include the following variations, amongst others:

The number of inputs may vary, e.g., for a four input system, only four inputs are applied.

The set of inputs 60 may have gain applied prior to the summing. This may be important in a fixed-point DSP device, where the level of the signals inside the feedback signal path 85 needs to be controlled to prevent overflow and/or to optimize the noise performance of the reverberator. How to so achieve the scaling would be known to those in the art of signal processing.

The output gain elements, e.g., 81 may be omitted. This may be appropriate, for example, if the input gain elements are providing the correct gain.

A reverberator such as that shown in FIG. 5 may be modified to use fewer inputs by simply omitting one or more of the summers 61, 86-89.

Figure 6:
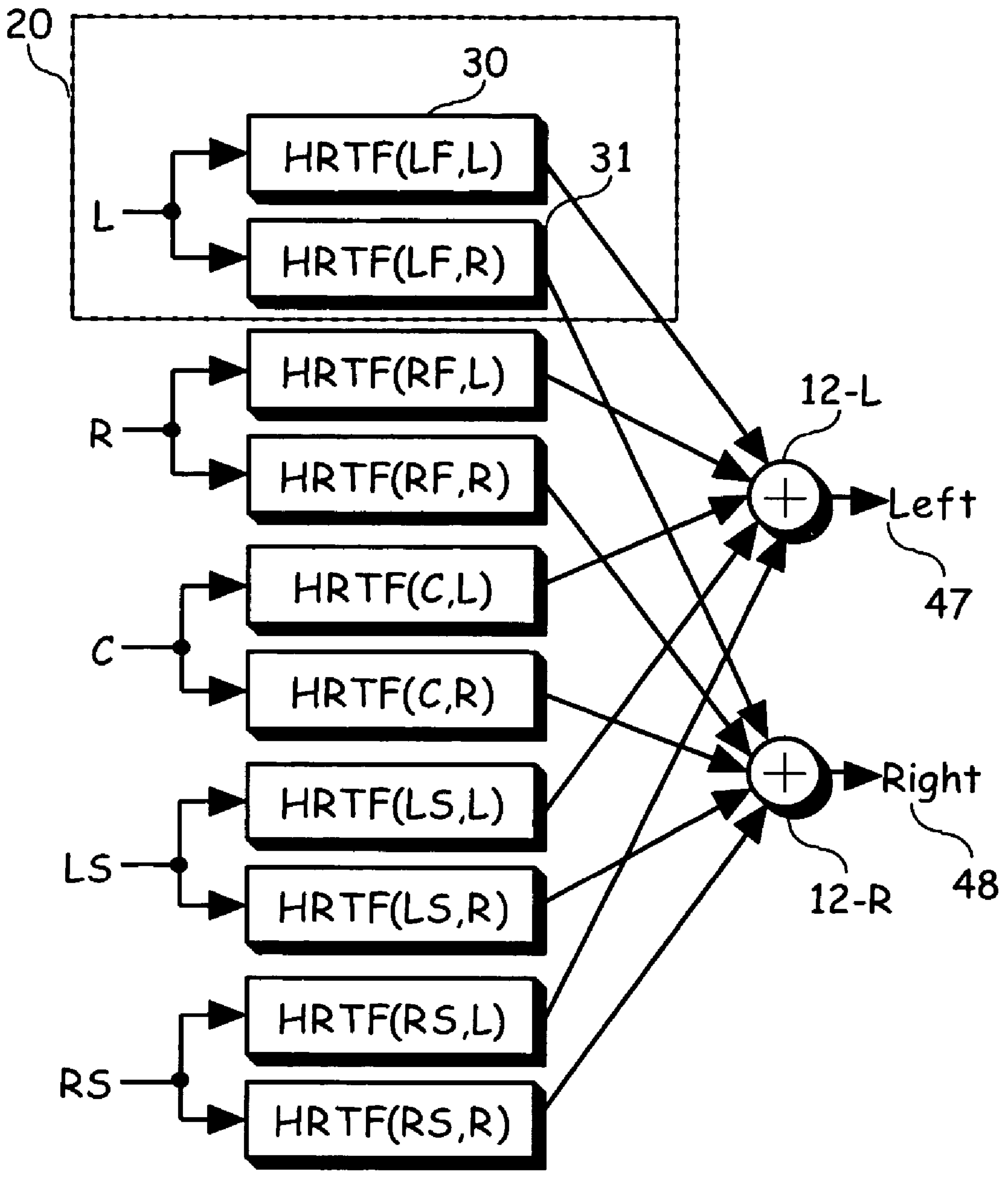
FIG. 6 illustrates the head related transfer function (HRTF) filtering process of the embodiment of FIG. 3 in more detail.

One embodiment of the bank of HRTF filters 20-24 of FIG. 3 is shown in more detail in FIG. 6. For example, filter 20 is shown in FIG. 6 as two filters 30, 31. The notation used for the HRTF is HRTF(source, out) where source is one of the input channels LF, C, RF, LS, or RS for left, center, right, let surround, and right surround, respectively, and out is one of L or R for left and right, respectively.

One embodiment assumes left-to-right symmetry. When such an assumption is made, then the following rules will hold:

HRTF(LF,L)=HRTF(RF,R)

HRTF(LF,R)=HRTF(RF,L)

HRTF(C,L)=HRTF(C,R)

HRTF(LS,L)=HRTF(RS,R)

HRTF(LS,R)=HRTF(RS,L)

Figure 7:
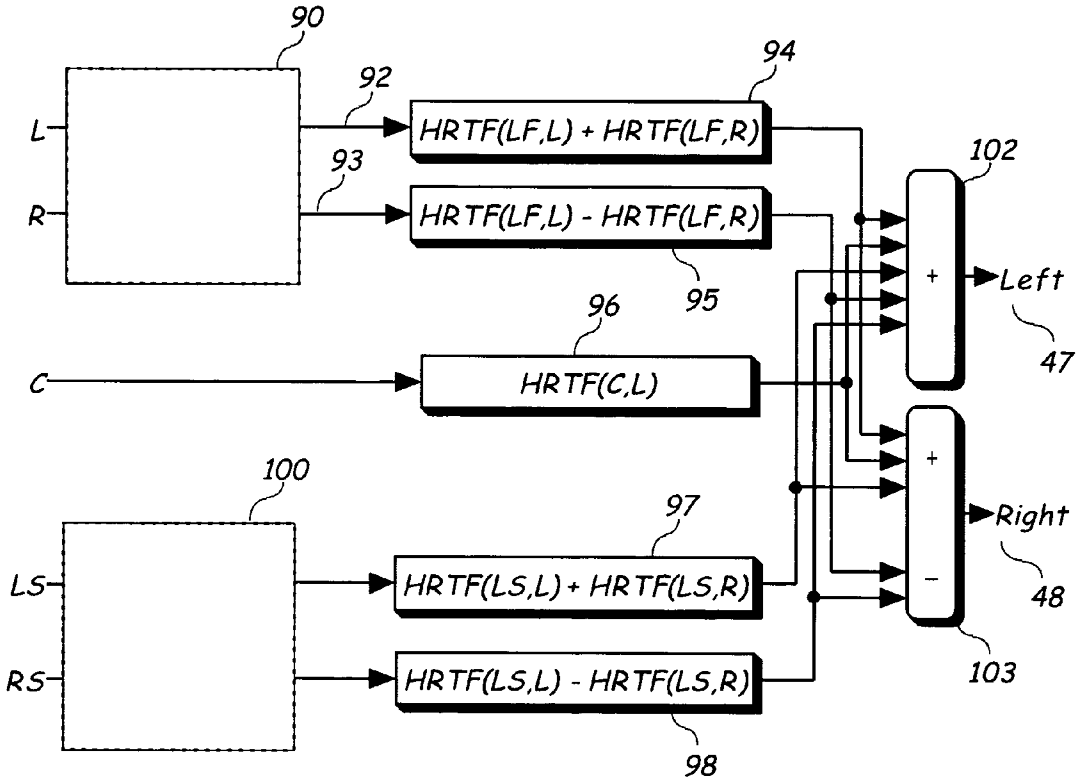
FIG. 7 illustrates an embodiment of the head related transfer function filtering.

When symmetry holds, a simplified embodiment can be used for the filter bank. One such embodiment is shown in FIG. 7. In this case, the L and R front and rear signals that input to the filter-bank are each processed by a "shuffler" unit, e.g., 90 for the front and 100 for the surround (rear) signals. Each shuffler computes a sum and a difference signal. For example shuffler 90 computes sum and difference signals 92 and 93, respectively, where the sum signal is half the sum of the left and right signals, while the difference signal is half the left signal less the right signal.

The use of such shufflers allows the bank of 10 filters of the embodiment of FIG. 6 to be replaced by only 5 filters, filters 94-98 as shown in FIG. 7. This reduction in the number of filters, and thus computational requirement, comes at a relatively moderate computational cost of having additional sum/difference blocks 90 and 100 on the inputs, connected to the L, R, LS, and RS inputs, respectively. Furthermore, summing junctions 102 and 103 are used. For example, summing junction 103 is used to compute the right output signal, and includes subtracting the outputs of filters 95 and 98.

Referring again to the reverberator shown in FIG. 5, the mixer 62 has 5 inputs and 5 outputs, and hence has 25 gain values. These gains may be specified by a 5×5 matrix G, according to the matrix equation:

$$\begin{pmatrix} Out_L \\ Out_R \\ Out_C \\ Out_{LS} \\ Out_{RS} \end{pmatrix} = G \begin{pmatrix} In_L \\ In_R \\ In_C \\ In_{LS} \\ In_{RS} \end{pmatrix},$$

where G is a 5×5 matrix that is non-diagonal, such that at least one output combines a plurality of inputs. In an exemplary embodiment, the elements of G are selected so that G is a unitary matrix. Because pre-multiplying the mixing matrix by a diagonal matrix is the same as applying a set of gain factors prior to the mixing, and post-multiplying the mixing matrix by a diagonal matrix is the same as applying a set of gain factors after the mixing, for the purposes herein, a unitary matrix is one that is unitary to within scale factors at the input and/or outputs of the mixing.

One aspect of the invention is the selection of the reverberation characteristics, which in turn includes the selection of the delays of the delay lines 63-67 and the properties of the filters 70-74 of FIG. 5.

Many methods are known for creating a unitary matrix. One method uses the following Matlab code:

```
>>X=randn(5);

>>[U,S,V]=svd(X);

>>M=U*V^T;
```

where * is the matrix multiplication and T is the transpose operator (assuming real valued matrices). This code starts by creating a random 5×5 matrix, X, with each element having a random Gaussian distribution, for example. The method then carries out a singular value decomposition (SVD) of the matrix X to generate three matrices (U, S and V) with the property that both matrices U and V are unitary, and X=U S $V^T$. The matrix G=U $V^T$ is therefore a unitary matrix that is derived from the random matrix X. The 5×5 matrix G can be used as the coefficients of the mixer in the reverberator.

As discussed before, any matrix that is derived from a strictly unitary matrix by pre-multiplying by a diagonal matrix, and/or post-multiplying by a diagonal matrix is regarded as "unitary" because such a matrix can be made unitary by gains at the inputs and/or outputs.

In an alternate embodiment, a set of candidate matrices is generated, e.g., using the randomizer as described in the MATLAB code above, and the best is selected based on listening tests.

Figure 8:
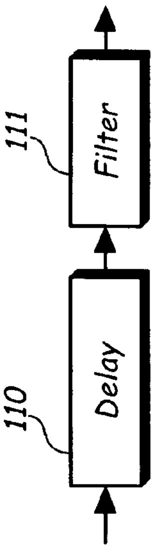
FIG. 8 illustrates a delay and filter structure in the embodiment of FIG. 5.
Figure 9:
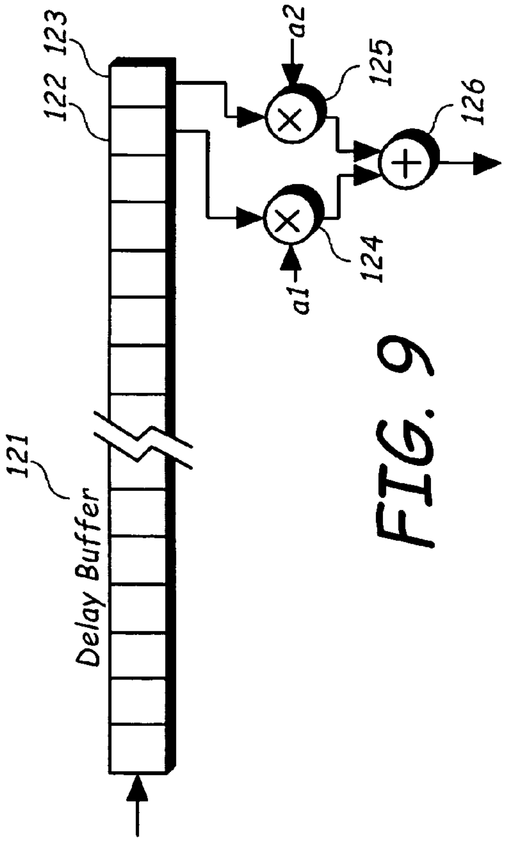
FIG. 9 shows a block diagram of one embodiment implementing the delay and filter structure of FIG. 8.

FIG. 8 shows a single delay 110 and filter block 111 combination. FIG. 9 shows one embodiment of the delay and filter combination. The filter in this embodiment is a first-order (2-tap) FIR filter that uses the delay line by tapping into the delay line. Thus, in one embodiment, the filtering and delay is accomplished by a single device. A delay buffer 121 delays the audio input data by a pre-determined number of sample periods. The last two taps 122 and 123, respectively, of the delay line are multiplied (weighted) by coefficient multipliers 124 and 125 that multiply the two taps by a1 and a2, respectively. The weighted tapped signals are summed by an adder 126 to form the delayed filtered output.

Five such structures can be used to implement the delays and filters of FIG. 5.

The coefficients a1 and a2 are chosen so as to provide the desired attenuation of the audio in the feedback signal path.

Figure 10:
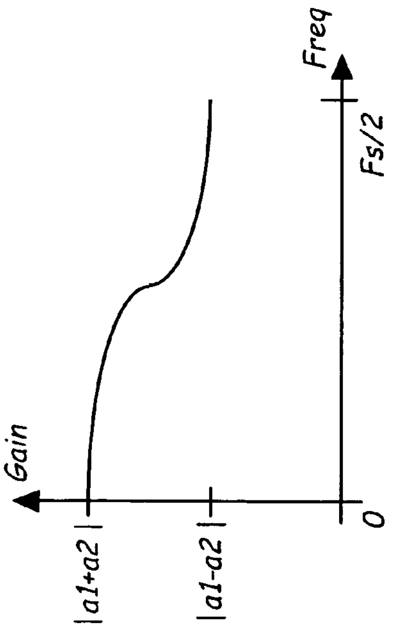
FIG. 10 shows an example of the filtering accomplished by the delay and filter structure, e.g., of FIG. 9.

FIG. 10 shows a typical desired frequency response of the 2-tap filter implemented in FIG. 9. In order for the gain matrix G to be unitary, the total gain of each filter should be less than unity at all frequencies.

Each of the filters 70-74 of FIG. 5 uses different sets of values for its respective coefficients a1 and a2. An alternate embodiment uses the same values of a1 and a2 for each filter.

One method of computing a1 and a2 is now described. The invention is not limited to this method, and the inventors found that this method provides pleasing results.

According to this method, each filter is selected to achieve a desired reverberation time at low frequencies and a desired reverberation time at high frequencies. Typical values for reverberation times for typical environments are known to or obtainable by those skilled in the art. To use implementations of the present invention, a user selects reverberation times suitable for the type of environment being simulated.

A desired reverberation time at low frequency, RT_low is chosen. A desired reverberation time at high frequency, DecayRate_high is also chosen. In one embodiment, the filter is then selected such that the low frequency desired reverberation time is the time taken for low frequencies of an audio signal to decay by 60 dB in the reverberator and the desired high-frequency reverberation time is the time taken for high frequencies to decay by 60 dB in the reverberator. Typical values of RT_low can be from 200 ms to 5 seconds, and even longer times are possible, while typical values of RT_high can be from 50 ms to 100 ms.

The two RT values are then converted into corresponding decay rates, denoted DecayRate_low and DecayRate_high, respectively, and in dB/second as follows:

$$\text{DecayRate\_low}=60/\text{RT\_low}, \text{ and}$$

$$\text{DecayRate\_high}=60/\text{RT\_high}.$$

For each Delay and Filter pair in the reverberator, the values of a1 and a2 can be computed as follows:

$$a1=(\text{LowFreqGain}+\text{HighFreqGain})/2 \text{ and}$$

$$a2=(\text{LowFreqGain}-\text{HighFreqGain})/2$$

where $$\text{LowFreqGain}=10^{(DecayRate\_low \times DelayTime)/20}, \text{ and}$$

$$\text{HighFreqGain}=10^{(DecayRate\_high \times DelayTime)/20},$$

where DelayTime is the length of the corresponding delay, in seconds. See below for how the length of each delay line is chosen.

Hence, the filter coefficients a1 and a2 are a function of DelayTime (the length of the delay, in seconds). This ensures that all components of the reverberation audio signals are attenuated by the same attenuation factor per second. Thus the attenuation of the filter is according to the length of the corresponding delay.

The delay lines are best set to a range of lengths. Denote these L0, L1, . . . , L5 for the 5-channel reverberator. One embodiment sets these such that there is no common factor in the set L0, L1, . . . , L5. Otherwise, the reverberator may fail to get a high density of reverberant impulse responses. In one embodiment, in general, each of the delay lengths is set to be approximately equal to the delay time of the first echo arrival in the room being simulated. In one preferred embodiment, the delays are between 2.5 to 4.5 milliseconds long. The delay lengths are selected so that the resulting echo patterns are uncorrelated for each HRTF direction.

One aspect used in the above embodiments is that only a relatively small number of HRTF directions can be used to provide spatialization for the reverberations. The inventors have found that a "full surround" effect for the reverberation occurs with only a relatively small number of spatialization directions.

In one embodiment shown, the number of such HRTF directions corresponded to the virtual directions of the plurality of input signals. This is not necessary. For example, fewer or more directions may be used than the number of input directions. One example shown above eliminated the center channel so it used four HRTF directions, while five input directions are provided. It is also possible to use more directions than the input signals.

Thus, while the embodiments described above are for binauralizing a surround sound signal such as one that has 4 or 5 inputs, the method is also applicable for use in other configurations.

Figure 11:
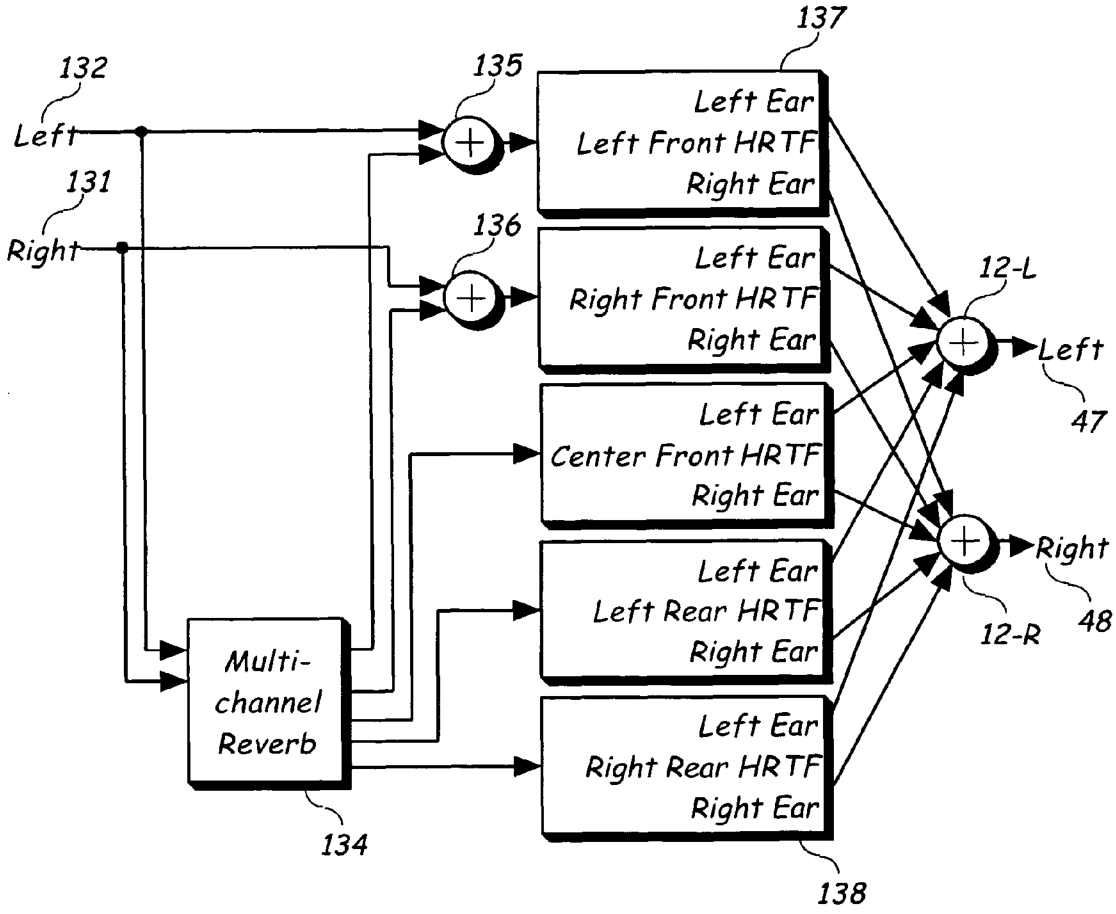
FIG. 11 is a simplified block diagram of one embodiment that processes stereo signals.

As an example, FIG. 11 shows an apparatus embodiment suitable for processing two (stereo) inputs 131 and 132 corresponding to two input directions to produce a set of stereo outputs 47 and 48. A two-input, 5-output multichannel reverberator 134 generates a set of surround sound signals for five directions, including the two input directions. A pair of summers 135, 136 add the left and right channel outputs of the reverberator to the inputs signals. The left and right signals, and the center, left surround, and right surround outputs of the reverberator 134 are input to a bank of HRTF filter pairs, each generating a left and a right output. The respective left and a right HRTF filter outputs are added to form the left and right outputs 47 and 48, respectively. The bank of HRTF filters 137 and 138 may be implemented, for example, using the structure of FIG. 7. The reverberator is similar to that previously described with reference to FIG. 5, with five feedback signal paths, one for each direction of the multi-input, two-output HRTF filter, except that only two inputs are accepted, the left and right (front) channels. The HRTF pairs of the HRTF filter are selected according to the desired environment.

Thus has been disclosed a method and an apparatus for generating a set of signals playable on headphones that provide a listener with the sensation of a set of virtual loudspeakers at a set of locations. The apparatus uses a multi-channel reverberator in conjunction with a bank of HRTF filter pairs. The multi-channel reverberator includes internal feedback signal paths for each location of a virtual speaker. Each feedback signal path is coupled to a corresponding HRTF filter pair. The reverberator includes a mixer describable by a mixing matrix. The inventors have found that using a unitary mixing matrix in the reverberator, together with filters in the feedback signal paths to provide the desired decay rate at low and right frequencies, creates a very pleasing surround sound experience, with the reverberations that are typical of a listening room, but using only a relatively small number of HRTF directions.

Note that in the description above, many details have been left out, as would be clear to those in the art. For example, common scale factors are not shown. Thus, for example, when it is stated that a unitary matrix is preferred for the mixing matrix G, those in the art will understand that this means unitary to within pre-multiplying and/or post-multiplying by a diagonal matrix. Furthermore, some further scaling may be required in implementation, e.g., when fixed-point arithmetic is used to implement the elements.

Note that while a different set of environment dependent parameters such as filter coefficients, delay line lengths, mixer matrix elements, and so forth are needed for each particular listening environments, e.g., each listening room, in practice, listening environments fall into types. The same parameters would be used for all rooms of any particular type. Thus a signal processor implementing the inventive method would include in the memory of the DSP system several different sets of parameters for respective different types of environments, e.g., a set for a large concert hall, a set for a small living room with soft furnishings, and so forth. A user would select the suitable listening environment according to type.

One embodiment of each of the methods described herein is in the form of a computer program that executes on a processing system, e.g., a one or more DSP devices that are part of a DSP system. How to program a DSP to implement each of the structures described above would be clear to those in the art. Alternately, each of the elements may be coded in a language such as Verilog, and an integrated circuit design that implements the structures shown. Thus, as will be appreciated by those skilled in the art, embodiments of the present invention may be embodied as a method, an apparatus such as a special purpose apparatus, an apparatus such as a data processing system, or a carrier medium, e.g., a computer program product. The carrier medium carries one or more computer readable code segments for controlling a processing system to implement a method. Accordingly, aspects of the present invention may take the form of a method, an entirely hardware embodiment, an entirely software embodiment or an embodiment combining software and hardware aspects. Furthermore, the present invention may take the form of carrier medium (e.g., a computer program product on a computer-readable storage medium) carrying computer-readable program code segments embodied in the medium. Any suitable computer readable medium may be used including a magnetic storage device such as a diskette or a hard disk, or an optical storage device such as a CD-ROM.

While the carrier medium is shown in an exemplary embodiment to be a single medium, the term "carrier medium" should be taken to include a single medium or multiple media (e.g., a centralized or distributed database, and/or associated caches and servers) that store the one or more sets of instructions. The term "carrier medium" shall also be taken to include any computer-readable storage medium that is capable of storing a set of instructions for execution by the machine and that cause the machine to perform any one or more of the methodologies of the present invention. A carrier medium may take many forms, including but not limited to, non-volatile media. Non-volatile media includes, for example, optical, magnetic disks, and magneto-optical disks. Volatile media includes dynamic memory, such as main memory. For example, the term "carrier medium" shall accordingly be taken to include, but not be limited to, solid-state memories, and optical and magnetic media.

It will be understood that the steps of methods discussed are performed in one embodiment by an appropriate processor (or processors) of a processing (i.e., computer) system executing instructions (code segments) stored in storage. It will also be understood that the invention is not limited to any particular implementation or programming technique and that the invention may be implemented using any appropriate techniques for implementing the functionality described herein. The invention is not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

All publications, patents, and patent applications cited herein are hereby incorporated by reference.

In the claims below and the description herein, the term "comprising" or "comprised of" or "which comprises" is an "open" term that means including at least the elements/features that follow, but not excluding others. The term "including" or "which includes" or "that includes" as used herein is also an "open" term that also means including at least the elements/features that follow the term, but not excluding others. Thus, including is synonymous with and means comprising.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention. Furthermore, the words comprising and comprise are meant in the sense of "including" and "include" so describe including at least the elements or steps described, and provide for additional elements or steps.

We claim:

1. An apparatus to process a plurality of input audio signals comprising:

a plurality of input terminals to accept a plurality of input signals;

a multi-input, multi-output reverberator accepting the plurality of input signals and arranged to generate a set of output signals, each reverberator output signal corresponding to a direction of sound arrival in a listening environment and including delayed echo components simulating the echoes a listener is likely to hear from the corresponding direction in the listening environment, such that each input to the multi-input, multi-output reverberator generates a plurality of outputs corresponding to a plurality of directions of sound arrival; and a multi-input, two-output filter with inputs coupled to the outputs of the reverberator, the inputs further coupled to the plurality of input terminals, one filter output for the left ear and one filter output for the right ear, the filter arranged to implement a number of head related transfer function (HRTF) filter pairs, each HRTF filter pair corresponding to an HRTF direction of arrival of sound in a listening environment, the two outputs playable through headphones, each HRTF filter pair including a left ear HRTF filter and a right ear HRTF filter, the sum of the left ear HRTF filter outputs forming the left ear output, and the sum of the right ear HRTF filter outputs forming the right ear output of the multi-input, two-output filter, wherein the reverberator includes a plurality of feedback signal paths, one for each HRTF direction for the listener, such that the coupling of the reverberator outputs to the multi-input, two-output filter couples each of the feedback signal paths to both the left ear HRTF filter and the right ear HRTF filter of a corresponding pair of the HRTF filter pairs, and wherein the reverberator further includes a multi-input, multi-output mixer with inputs coupled to the input terminals and to the outputs of the feedback signal paths, the mixer arranged to mix the plurality of inputs, the mixer outputs coupled to the feedback signal paths, the mixing describable by a non-diagonal matrix, such that at least one mixer output is generated by combining a plurality of mixer inputs, such that each direct sound corresponding to an input and every separate echo generated by a corresponding reverberator output is processed by both HRTF filters of one pair of the HRTF filter pairs such that each reverberator output is associated with a corresponding binaurally rendered direction of sound arrival, such that the listener listening to the left and right output signals in the listening environment through headphones has the sensation of listening to the plurality of input audio signals as if they are emanating from a plurality of loudspeakers spatially located at the loudspeaker locations in the listening environment.

2. An apparatus as recited in claim 1, wherein the reverberator is arranged in the forming of at least one of the echo components to combine a plurality of the accepted input signals, and wherein the reverberator is further arranged to process each of the input signals differently.

3. An apparatus as recited in claim 2, further comprising:

a first set of combiners coupled to the inputs of the reverberator and to the input terminals, arranged to combine the plurality of inputs with the set of reverberator outputs to generate a set of inputs for the multi-input, multi-output filters.

4. An apparatus as recited in claim 2, wherein the filter is arranged to generate two sets of outputs for each HRTF filter pair, one set for the left ear, and one set for the right ear, and wherein the filter includes a second set of combiners arranged to combine the left ear set of outputs and the right ear set of outputs to form the left-ear output signal and the right-ear output signal, respectively.

5. An apparatus as recited in claim 2, wherein the reverberator is arranged such that that the echo components include a series of mixed, delayed and filtered versions of the accepted input signals.

6. An apparatus as recited in claim 1, wherein the matrix is a unitary matrix to within each input being multiplied by a respective gain describable by pre-multiplying by a diagonal matrix and/or within each output being multiplied by a respective gain describable by post-multiplying by a diagonal matrix.

7. An apparatus as recited in claim 1, wherein the coupling of the mixer inputs to the input terminals is via a third set of combiners arranged to combine the inputs with delayed filtered versions of the mixer outputs, such that the reverberator includes a plurality of feedback signal paths, with at least one feedback signal path including a delay and filter.

8. An apparatus as recited in claim 1, wherein each of the feedback signal paths includes a delay and filter, each respective filter to produce a desired decay rate that varies with the frequency for echoes produced by the respective feedback signal path, and each respective delay being selected to provide a desired pattern of echoes for the listening environment.

9. An apparatus as recited in claim 8, wherein each filter is selected to achieve a desired reverberation time at low frequencies and a desired reverberation time at high frequencies.

10. An apparatus as recited in claim 8, wherein the delays of the different feedback signal paths are selected to be different with no common factor.

11. An apparatus as recited in claim 10, wherein each of the delays of the different feedback signal paths is selected to be approximately equal to the delay time of the first echo arrival in the listening environment.

12. An apparatus as recited in claim 10, wherein each of the delays of the different feedback signal paths is selected such that the patterns of echoes are uncorrelated for each feedback signal path.

13. An apparatus as recited in claim 1, wherein the number of HRTF directions is less than the number of input signals in the plurality of audio input signals.

14. An apparatus as recited in claim 1, wherein the number of HRTF directions is greater than the number of input signals in the plurality of audio input signals.

15. An apparatus as recited in claim 1, wherein the apparatus further includes a memory arranged to store at least one set of parameters for at least one listening environment, each set sufficient to simulate a listening environment.

16. An apparatus as recited in claim 15, wherein the memory is loaded with a plurality of sets of parameters for a plurality of sets of listening environments.

17. An apparatus as recited in claim 1, wherein the filter and reverberator are implemented by a DSP system having a memory.

18. A method to process a plurality of input audio signals comprising:

accepting a plurality of input signals;

generating a set of reverberator output signals from the plurality of input signals, each reverberator output signal corresponding to a direction of sound arrival in a listening environment, the generating including forming delayed echo components that simulate the echoes a listener is likely to hear from the corresponding direction in the listening environment, such that each input generates a plurality of reverberator output signals corresponding to a plurality of directions of sound arrival; and filtering combinations of the input signals and reverberator output signals to produce two outputs, one filter output for the left ear and one filter output for the right ear, the filter implementing a number of head related transfer function (HRTF) filter pairs, each HRTF filter pair corresponding to an HRTF direction of arrival of sound in a listening environment, the two outputs playable through headphones, each HRTF filter pair including a left ear HRTF filter and a right ear HRTF filter, the sum of the left ear HRTF filter outputs forming the left ear output, and the sum of the right ear HRTF filter outputs forming the right ear output of the multi-input, two-output filter, wherein the generating of the set of reverberator output signals includes mixing the plurality of input signals, the mixing describable by a non-diagonal matrix, such that at least one mixing output is generated by combining a plurality of mixing inputs, and wherein the generating of the set of reverberator output signals includes combining the plurality of input signals with delayed filtered versions of the mixer outputs, such that the generating of the set of reverberator output signals includes providing a plurality of feedback signal paths, with at least one feedback signal path including delaying and filtering such that each direct sound corresponding to an input and every separate echo in a corresponding reverberator output signal is processed by both HRTF filters of one pair of the HRTF filter pairs, such that each reverberator output signal is associated with a corresponding binaurally rendered direction of sound arrival, such that the listener listening to the left and right output signals in the listening environment through headphones has the sensation of listening to the plurality of input audio signals as if they are emanating from a plurality of loudspeakers spatially located at the loudspeaker locations in the listening environment.

19. A method as recited in claim 18, wherein the forming of at least one of the echo components includes combining a plurality of the accepted input signals, and wherein the generating of a set of reverberator output signals processes different input signals differently.

20. A method as recited in claim 19, further comprising:

combining the plurality of inputs with the set of reverberator outputs to generate a set of inputs for the reverberating.

21. A method as recited in claim 19, wherein the echo components include a series of mixed, delayed and filtered versions of the accepted input signals.

22. A method as recited in claim 19, wherein the matrix is a unitary matrix to within each input being multiplied by a respective gain describable by pre-multiplying by a diagonal matrix and/or within each output being multiplied by a respective gain describable by post-multiplying by a diagonal matrix.

23. A method as recited in claim 18, wherein the filtering implements a plurality of HRTF filter pairs for a corresponding plurality of HRTF directions, one pair for each HRTF direction for the listener, wherein the generating of reverberator outputs includes providing a plurality of feedback signal paths, one for each HRTF direction for the listener, and wherein the method further includes coupling each of the feedback signal paths to both the left ear HRTF filter and the right ear HRTF filter of a corresponding pair of the HRTF filter pairs.

24. A method as recited in claim 23, wherein each of the feedback signal paths includes delaying and filtering, wherein each filter step is to produce a desired decay rate that varies with the frequency for echoes produced by the respective feedback signal path, and wherein each respective delaying step includes applying a respective delay selected to provide a desired pattern of echoes for the listening environment.

25. A method as recited in claim 24, wherein the filtering in each feedback signal path is selected to achieve a desired reverberation time at low frequencies and a desired reverberation time at high frequencies.

26. A method as recited in claim 24, wherein the delays of the different feedback signal paths are selected to be different with no common factor.

27. A method as recited in claim 26, wherein each of the delays of the different feedback signal paths is selected to be approximately equal to the delay time of the first echo arrival in the listening environment.

28. A method as recited in claim 26, wherein each of the delays of the different feedback signal paths is selected such that the patterns of echoes are uncorrelated for each feedback signal path.

29. A method as recited in claim 23, wherein the number of HRTF directions is less than the number of input signals in the plurality of audio input signals.

30. A method as recited in claim 23, wherein the number of HRTF directions is greater than the number of input signals in the plurality of audio input signals.

31. A non-transitory computer-readable storage medium on which is stored at least one code segment that when executed by at least one processor of a processing system causes carrying out a method, the method to process a plurality of input audio signals, the method comprising:

accepting a plurality of input signals;

generating a set of reverberator output signals from a plurality of input signals, each reverberator output signal corresponding to a direction of sound arrival in a listening environment, the generating including forming delayed echo components simulating the echoes a listener is likely to hear from the corresponding direction in the listening environment, such that each input to the multi-input, multi-output reverberator generates a plurality of outputs corresponding to a plurality of directions of sound arrival; and filtering combinations of the input signals and reverberator output signals to produce two outputs, one filter output for the left ear and one filter output for the right ear, the filter implementing a number of head related transfer function (HRTF) filter pairs, each HRTF filter pair corresponding to an HRTF direction of arrival of sound in a listening environment, the two outputs playable through headphones, each HRTF filter pair including a left ear HRTF filter and a right ear HRTF filter, the sum of the left ear HRTF filter outputs forming the left ear output, and the sum of the right ear HRTF filter outputs forming the right ear output of the multi-input, two-output filter, wherein the generating of the set of reverberator output signals includes mixing the plurality of input signals, the mixing describable by a non-diagonal matrix, such that at least one mixing output is generated by combining a plurality of mixing inputs, and wherein the generating of the set of reverberator output signals includes combining the accepted inputs with delayed filtered versions of the mixer outputs, such that the generating of the set of reverberator output signals includes providing a plurality of feedback signal paths, with at least one feedback signal path including delaying and filtering, such that each direct sound corresponding to an input and every separate echo in a corresponding reverberator output signal is processed by both HRTF filters of one pair of the HRTF filter pairs such that each reverberator output signal is associated with a corresponding binaurally rendered direction of sound arrival, such that the listener listening to the left and right output signals in the listening environment through headphones has the sensation of listening to the plurality of input audio signals as if they are emanating from a plurality of loudspeakers spatially located at the loudspeaker locations in the listening environment.

32. A non-transitory computer-readable storage medium as recited in claim 31, wherein the forming of at least one of the echo components includes combining a plurality of the accepted input signals, and wherein the generating of a set of reverberator output signals processes different input signals differently.

33. A non-transitory computer-readable storage medium as recited in claim 32, wherein the echo components include a series of mixed, delayed and filtered versions of the accepted input signals.

34. A non-transitory computer-readable storage medium as recited in claim 31, wherein the filtering implements a plurality of HRTF filter pairs for a corresponding plurality of HRTF directions, one pair for each HRFT direction for the listener, and wherein the method further includes coupling each of the feedback signal paths to both the left ear HRTF filter and the right ear HRTF filter of a corresponding pair of the HRTF filter pairs.

35. A non-transitory computer-readable storage medium as recited in claim 34, wherein each of the feedback signal paths includes delaying and filtering, wherein each filter step is to produce a desired decay rate that varies with the frequency for echoes produced by the respective feedback signal path, and wherein each respective delaying step includes applying a respective delay selected to provide a desired reverberation pattern for the listening environment.

36. A non-transitory computer-readable storage medium as recited in claim 35, wherein the filtering in each feedback signal path is selected to achieve a desired reverberation time at low frequencies and a desired reverberation time at high frequencies.

37. A non-transitory computer-readable storage medium as recited in claim 35, wherein the delays of the different feedback signal paths are selected to be different with no common factor.

38. A non-transitory computer-readable storage medium as recited in claim 37, wherein each of the delays of the different feedback signal paths is selected to be approximately equal to the delay time of the first echo arrival in the listening environment.

39. A non-transitory computer-readable storage medium as recited in claim 37, wherein each of the delays of the different feedback signal paths is selected such that the patterns of echoes are uncorrelated for each feedback signal path.

40. A non-transitory computer-readable storage medium as recited in claim 34, wherein the number of HRTF directions is less than the number of input signals in the plurality of audio input signals.

41. A non-transitory computer-readable storage medium as recited in claim 34, wherein the number of HRTF directions is greater than the number of input signals in the plurality of audio input signals.

42. An apparatus to process a plurality of input audio signals comprising:

means for accepting a plurality of input signals;

means for generating a set of reverberator output signals from a plurality of input signals, each reverberator output signal corresponding to a direction of sound arrival in a listening environment, including forming delayed echo components simulating the echoes a listener is likely to hear from the corresponding direction in the listening environment, such that each input generates a plurality of reverberator output signals corresponding to a plurality of directions of sound arrival; and means for filtering combinations of the input signals and reverberator output signals to produce two outputs, one filter output for the left ear and one filter output for the right ear, the filter implementing a number of head related transfer (HRTF) filter pairs, each HRTF filter pair corresponding to an HRTF direction of arrival of sound in a listening environment, the two outputs playable through headphones, each HRTF filter pair including a left ear HRTF filter and a right ear HRTF filter, the sum of the left ear HRTF filter outputs forming the left ear output, and the sum of the right ear HRTF filter outputs forming the right ear output of the multi-input, two-output filter, wherein the means for generating of the set of reverberator output signals is configured to mix the plurality of input signals, the mixing describable by a non-diagonal matrix, such that at least one mixing output is generated by combining a plurality of mixing inputs, and wherein the means for generating the set of reverberator output signals is configured to combine the plurality of input signals with delayed filtered versions of the mixer outputs, such that the means for generating of the set of reverberator output signals includes providing a plurality of feedback signal paths, with at least one feedback signal path including delaying and filtering, such that each direct sound corresponding to an input and every separate echo in a corresponding reverberator output signal is processed by one of the HRTF filter pairs, such that each reverberator output signal is associated with a corresponding binaurally rendered direction of sound arrival, such that the listener listening to the left and right output signals in the listening environment through headphones has the sensation of listening to the plurality of input audio signals as if they are emanating from a plurality of loudspeakers spatially located at the loudspeaker locations in the listening environment.

43. An apparatus as recited in claim 42, wherein the forming of at least one of the echo components includes combining a plurality of the accepted input, and wherein the generating of a set of reverberator output signals processes different input signals differently.

44. An apparatus as recited in claim 42, wherein the echo components include a series of mixed, delayed and filtered versions of the accepted input signals.

45. An apparatus as recited in claim 42, wherein the matrix is a unitary matrix to within each input being multiplied by a respective gain describable by pre-multiplying by a diagonal matrix and/or within each output being multiplied by a respective gain describable by post-multiplying by a diagonal matrix.

46. An apparatus as recited in claim 42, wherein each of the feedback signal paths includes delaying and filtering, wherein each filtering step is to produce a desired decay rate that varies with the frequency for echoes produced by the respective feedback signal path, and wherein each respective delaying step includes applying a respective delay selected to provide a desired pattern of echoes for the listening environment.

47. An apparatus as recited in claim 46, wherein the filtering in each feedback signal path is selected to achieve a desired reverberation time at low frequencies and a desired reverberation time at high frequencies.

48. An apparatus as recited in claim 46, wherein the delays of the different feedback signal paths are selected to be different with no common factor.

49. An apparatus as recited in claim 46, wherein each of the delays of the different feedback signal paths is selected to be approximately equal to the delay time of the first echo arrival in the listening environment.

50. An apparatus as recited in claim 46, wherein each of the delays of the different feedback signal paths is selected such that the patterns of echoes are uncorrelated for each feedback signal path.

51. An apparatus as recited in claim 42, wherein the number of HRTF directions is less than the number of input signals in the plurality of audio input signals.

52. An apparatus as recited in claim 42, wherein the number of HRTF directions is greater than the number of input signals in the plurality of audio input signals.

* * * * *

UNITED STATES PATENT AND TRADEMARK OFFICE

CERTIFICATE OF CORRECTION

PATENT NO. : 7,949,141 B2
APPLICATION NO. : 10/970123
DATED : May 24, 2011
INVENTOR(S) : Reilly et al.

It is certified that error appears in the above-identified patent and that said Letters Patent is hereby corrected as shown below:

In Column 11, line 34, after "but not limited to, non-volatile media", insert --and volatile media--.

Signed and Sealed this
Nineteenth Day of July, 2011

David J. Kappos
*Director of the United States Patent and Trademark Office*